(12) United States Patent
Fu et al.

(10) Patent No.: US 9,449,907 B2
(45) Date of Patent: Sep. 20, 2016

(54) STACKED SEMICONDUCTOR CHIPS PACKAGING

(71) Applicant: Advanced Micro Devices, Inc., Sunnyvale, CA (US)

(72) Inventors: Lei Fu, Austin, TX (US); Frank Gottfried Kuechenmeister, Dresden (DE); Michael Zhuoying Su, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/737,716

(22) Filed: Jun. 12, 2015

(65) Prior Publication Data
US 2015/0279773 A1 Oct. 1, 2015

Related U.S. Application Data

(63) Continuation of application No. 13/017,946, filed on Jan. 31, 2011.

(51) Int. Cl.
| H01L 21/48 | (2006.01) |
| H01L 25/07 | (2006.01) |
| H01L 23/498 | (2006.01) |
| H01L 21/768 | (2006.01) |
| H01L 25/065 | (2006.01) |
| H01L 25/00 | (2006.01) |
| H01L 23/48 | (2006.01) |

(52) U.S. Cl.
CPC ....... *H01L 23/49827* (2013.01); *H01L 21/486* (2013.01); *H01L 21/4853* (2013.01); *H01L 21/76898* (2013.01); *H01L 23/481* (2013.01); *H01L 23/49811* (2013.01); *H01L 23/49838* (2013.01); *H01L 25/0657* (2013.01); *H01L 25/073* (2013.01); *H01L 25/50* (2013.01); *H01L 2224/73204* (2013.01); *H01L 2225/06513* (2013.01); *H01L 2225/06517* (2013.01); *H01L 2225/06541* (2013.01); *H01L 2924/01322* (2013.01); *H01L 2924/15311* (2013.01)

(58) Field of Classification Search
None
See application file for complete search history.

(56) References Cited

U.S. PATENT DOCUMENTS

| 6,053,397 | A | 4/2000 | Kaminski |
| 6,451,626 | B1 | 9/2002 | Lin |
| 6,525,413 | B1 | 2/2003 | Cloud et al. |
| 6,661,086 | B2 | 12/2003 | Zelsacher |
| 6,683,374 | B2 | 1/2004 | Goller et al. |
| 6,794,741 | B1 | 9/2004 | Lin et al. |
| 6,847,105 | B2 | 1/2005 | Koopmans |
| 6,984,889 | B2 | 1/2006 | Kimura |

(Continued)

OTHER PUBLICATIONS

Keigler, Arthur et al.; Copper Deposition for Pillar and Vias; Semiconductor Manufacturing; vol. 7, Issue 8; Aug. 2006.

(Continued)

*Primary Examiner* — Alexander Ghyka
(74) *Attorney, Agent, or Firm* — Faegre Baker & Daniels LLP

(57) ABSTRACT

Various methods and apparatus for joining stacked substrates to a circuit board are disclosed. In one aspect, a method of manufacturing is provided that includes coupling plural substrates to form a stack. At least one of the plural substrates is a semiconductor chip. Plural conductive vias are formed in a first of the plural substrates. Each of the plural conductive vias includes a first end positioned in the first substrate and a second end projecting out of the first substrate.

11 Claims, 6 Drawing Sheets

(56) References Cited

U.S. PATENT DOCUMENTS

| | | |
|---|---|---|
| 7,132,736 B2 | 11/2006 | Bakir et al. |
| 7,183,648 B2 | 2/2007 | Ramanathan et al. |
| 7,205,646 B2 | 4/2007 | Lin et al. |
| 7,217,999 B1 | 5/2007 | Honda |
| 7,453,150 B1 | 11/2008 | McDonald |
| 7,462,930 B2 | 12/2008 | Lee et al. |
| 7,468,558 B2 | 12/2008 | Bakir et al. |
| 7,498,668 B2 | 3/2009 | Kawabata et al. |
| 7,518,230 B2 | 4/2009 | Miyata et al. |
| 7,545,028 B2 | 6/2009 | Zhang |
| 2006/0201997 A1 | 9/2006 | Tung |
| 2009/0041981 A1 | 2/2009 | Hsu |
| 2010/0015762 A1* | 1/2010 | Khan ............ H01L 21/563 438/124 |
| 2011/0042798 A1 | 2/2011 | Pagaila et al. |

OTHER PUBLICATIONS

Baliga, John; Yet Another Way to Use BCB; from www.semiconductor.net; Jul. 1, 2006.

* cited by examiner

STACKED SEMICONDUCTOR CHIPS PACKAGING

CROSS-REFERENCE TO RELATED APPLICATION

This application is a continuation of U.S. patent application Ser. No. 13/017,946, filed Jan. 31, 2011, which is incorporated herein by reference in its entirety for all purposes.

BACKGROUND OF THE INVENTION

1. Field of the Invention

This invention relates generally to semiconductor processing, and more particularly to methods and apparatus for stacking multiple semiconductor devices and packaging the same.

2. Description of the Related Art

Some time ago semiconductor chip designers began stacking multiple semiconductor dice (aka "dies") vertically in order to obtain more functionality without an attendant increase in required package substrate or circuit board area. A variety of techniques have been used to electrically connect adjacent dice in such stacked arrangements. One technique has involved the use of wire bonds leading from contact pads on one die to corresponding contact pads on an adjacent die. Another technique that has been introduced more recently involves the use of so-called thru-silicon-vias (TSV). A typical TSV is a conductive via that extends nearly or perhaps entirely through a semiconductor chip, depending on the presence or absence of any intervening conductor pads at one or the other of the principal surfaces of the chip.

Most semiconductor chips are eventually mounted to some form of circuit board or enclosure. Typical examples include semiconductor chip package substrates, circuit cards, motherboards and other types of packaging closures. A technical challenge associated with most mounting schemes is the establishment of electrical interfaces between the semiconductor die or dice and the receiving circuit board. The fabrication of these electrical interfaces may be particularly challenging in a stacked dice arrangement. This follows from the fact that the multiple semiconductor chips may, by definition, include a significantly higher number of input outputs than a single semiconductor device.

One conventional technique for establishing electrical interconnects between a stacked dice arrangement and a circuit board involves the use of wire bond interconnects. Plural wire bonds are connected to conductor pads on one or more of the dice in the stacked dice arrangement and also to corresponding conductor pads on the circuit board or some other device on the circuit board. Another conventional arrangement for connecting a stacked dice arrangement to a circuit board involves the use of some form of control collapse bump arrangement wherein the plural solder joints are established between a lowermost of the stacked dice and the circuit board. This typically entails the formation of a solder bump on the lowermost die and a corresponding solder bump on the circuit board followed by a solder reflow process.

A more recent innovation involves the use of copper pillars that project outwardly from the lowermost die of a stacked dice arrangement and interconnect electrically with a circuit board. This conventional arrangement utilizes a low profile solder paste placed in plural low-profile openings in a solder mask on the circuit board. The lower ends of each of the copper pillars is fitted with a small solder cap. To establish the requisite connections, the die is positioned so that the solder caps of the copper pillars are in proximity or in contact with the low profile solder paste portions and a reflow process is performed. Expenses in the form of material and labor costs are associated with the conventional copper pillar process.

The present invention is directed to overcoming or reducing the effects of one or more of the foregoing disadvantages.

SUMMARY OF EMBODIMENTS OF THE INVENTION

In accordance with one aspect of the present invention, a method of manufacturing is provided that includes coupling plural substrates to form a stack. At least one of the plural substrates is a semiconductor chip. Plural conductive vias are formed in a first of the plural substrates. Each of the plural conductive vias includes a first end positioned in the first substrate and a second end projecting out of the first substrate.

In accordance with another aspect of the present invention, a method of manufacturing is provided that includes providing a circuit board that includes an outermost surface and plural conductor pads. A solder structure is formed on each of the plural conductor pads. Each of the solder structures includes a portion projecting beyond the outermost surface. The solder structures are coupled to corresponding conductive vias of a stack of substrates. At least one of the substrates is a semiconductor chip.

In accordance with another aspect of the present invention, an apparatus is provided that has a stack including plural substrates. At least one of the plural substrates is a semiconductor chip. Plural conductive vias are coupled to a principal surface of a first of the plural substrates. Each of the plural conductive vias includes a first end positioned in the first substrate and a second end projecting away from the principal surface of the first substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip device that includes two or more stacked substrates are described herein. One example includes multiple substrates that may be semiconductor chips stacked and mounted on a circuit board. The lowermost of the substrates includes conductive vias that project beyond the chip and metallurgically bond with vertically projecting solder structures, such as solder pillars. The combination of the projecting vias and projecting solder structures provides sufficient solder volume to wet during reflow without the requirement to separately plate the vias with solder. Additional details will now be described.

Figure 1:
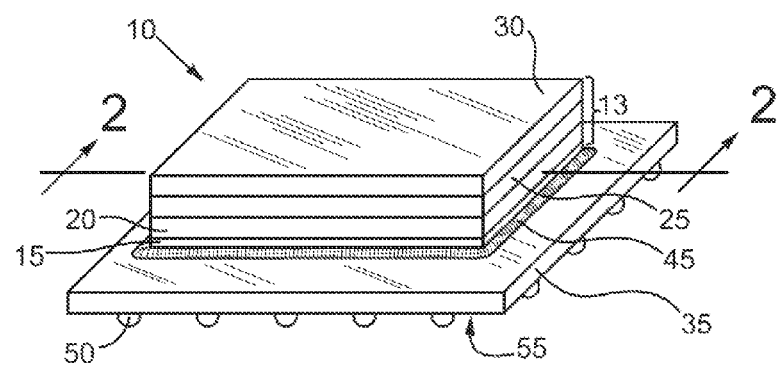
FIG. 1 is a pictorial view of an exemplary embodiment of a semiconductor chip device that includes a stack of four substrates mounted on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a stack 13 of four substrates 15, 20, 25 and 30 mounted on a circuit board 35. The exemplary stack 13 is depicted with four substrates 15, 20, 25 and 30. However, the stack 13 may consist of two or more semiconductor substrates. The substrates 15, 20, 25 and 30 may be semiconductor chips, interposers or other devices. If implemented as semiconductor chips, the substrates 15, 20, 25 and 30 may be any of a myriad of different types of circuit devices used in electronics, such as, for example, microprocessors, graphics processors, combined microprocessor/graphics processors, application specific integrated circuits, memory devices or the like, and may be single or multi-core. The substrates 15, 20, 25 and 30 may be constructed of bulk semiconductor, such as silicon or germanium, or semiconductor-on-insulator materials, such as silicon-on-insulator materials. If implemented as interposers, any of the substrates 15, 20, 25 and 30 may be fabricated from the same types of materials or even ceramics or polymeric materials.

The circuit board 35 may be a semiconductor chip package substrate, a circuit card, or virtually any other type of printed circuit board. A monolithic structure could be used for the circuit board 35, although a more typical configuration will utilize a build-up design. In this regard, the circuit board 35 may consist of a central core upon which one or more build-up layers are formed and below which an additional one or more build-up layers are formed. The core itself may consist of a stack of one or more layers. If implemented as a semiconductor chip package substrate, the number of layers in the circuit board 35 can vary from four to sixteen or more, although less than four may be used. So-called "coreless" designs may be used as well. The layers of the circuit board 35 may consist of an insulating material, such as various well-known epoxies, interspersed with metal interconnects. A multi-layer configuration other than buildup could be used. Optionally, the circuit board 35 may be composed of well-known ceramics or other materials suitable for package substrates or other printed circuit boards.

The circuit board 35 is provided with a number of conductor traces and vias and other structures (not visible) in order to provide power, ground and signals transfers between the semiconductor chip 110 and another device, such as another circuit board for example. The circuit board 35 may be electrically connected to another device (not shown) by way of an input/output array such as the ball grid array 50 provided on the under surface 55 of the circuit board 35.

Electrical pathways between the substrates 15, 20, 25 and 30 and the circuit board 35 as well as between any of the substrates 15, 20, 25 and 30 are provided by plural interconnect structures that are not visible in FIG. 1 but will be depicted in subsequent figures and described accordingly. These interconnect structures may be fabricated inside the substrates 15, 20, 25 and 30.

An underfill material layer 45 is dispensed between the substrate 15 and the circuit board 35 to alleviate issues of differential coefficient of thermal expansion. The underfill 45 may be formed from well-known polymeric materials, such as epoxies or others, with or without some form of filler, such as fiberglass or others. Only a portion of the underfill 45 is visible around the periphery of the substrate 15.

Figure 2:
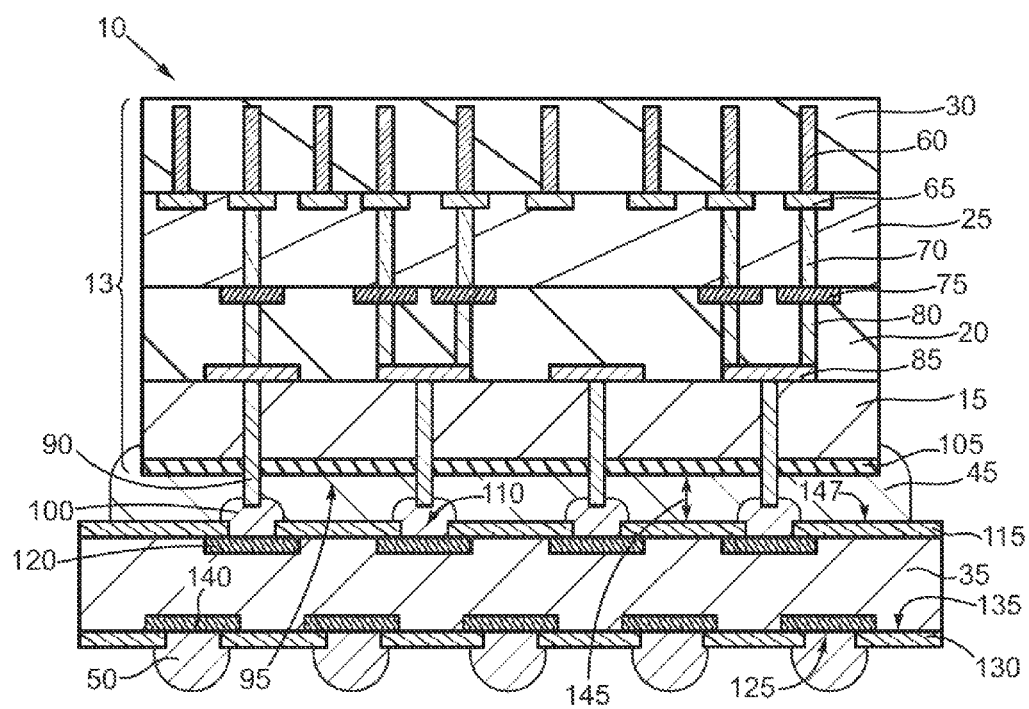
FIG. 2 is a sectional view of FIG. 1 taken at section 2-2.

Attention is now turned to FIG. 2, which is a sectional view of FIG. 1 taken at section 2-2. As noted above, the stack 13 of substrates 15, 20, 25 and 30 includes plural interconnect structures to provide various electrical pathways. In this regard, the substrate 30 may be provided with plural conducting structures or vias 60 that may interface with corresponding conductor pads 65 of the substrate 25. The substrate 25 includes, in turn, plural vias 70 connected to some or all of the conductor pads 65. The substrate 20 may include similarly plural conductor pads 75 tied to some or all of the vias 70 of the chip 25 as well as vias 80 connected to conductor pads 85. To interface the stack 13 electrically with the circuit board 35, the lowermost substrate 15 may be provided with plural conductive vias 90 that project beyond a principal surface 95 thereof and interface with corresponding solder structures 100 of the circuit board 35. For simplicity of illustration, only four vias 90 and solder structures 100 are depicted. However, the skilled artisan will appreciate that the populations of such structures may number in the hundreds of thousands depending upon the complexity of the stack 13 and the circuit board 35. The principal surface 95 of the substrate 15 may actually be the facing surface of a polymeric layer 105 composed of materials such as polyimide or other polymeric materials that are suitable to provide compliant protection for any delicate circuit structures in the vicinity of the polymeric layer 105. The layer 105 could also be a redistribution layer, in which a polymer or oxide material is used as insulating material.

The conductor structures in the various substrates 15, 20, 25 and 30 may be fabricated using well-known lithography and material deposition and/or removal techniques. Any or all of the vias, such as the vias 60, may be formed by fabricating plural holes or trenches in the substrate 30 and thereafter depositing or by plating, chemical vapor deposition, physical deposition, e-beam deposition or other techniques. A variety of conductor materials may be used, such as copper, gold, platinum, palladium, aluminum, titanium, refractory metals, refractory metal compounds, alloys of these or the like. Hole or trench formation may be by chemical etching, laser drilling or other material removal techniques. Higher aspect ratio openings will generally require more anisotropic techniques, such as laser drilling or plasma etching. The various pads, such as the pad 65 or 75 may be fabricated using the same techniques or alternatively by way of build up processes in which conductor material layer is plated and subsequently patterned by etch definition or other material removal techniques into the desired shapes for the pads 65, 75, etc.

The substrates 15, 20, 25 and 30 may be joined to one another to form the stack 13 in a variety of ways. Exemplary techniques include copper-to-copper direct bonding, silicon dioxide-to-silicon diffusion bonding, the application of an adhesive or other techniques. The copper-to-copper and silicon dioxide-to-silicon diffusion bonding involve pressing two substrates together so that corresponding conductor structures are touching or nearly, such as the vias 90 and the pads 85, and heating the combination to initiate the bonding. If an adhesive is contemplated, materials such as benzocylobutene or the like may be applied to one or both of the facing substrates and a thermal cure performed. The stacking may be performed on so-called die-to-die, die-to-wafer or even wafer-to-wafer bases. If die-to-wafer or wafer-to-wafer is used, singulation will follow the joining operation. Wafer-to-wafer joining may be more attractive where the dice to be joined are roughly the same size. Ohmic contact between the conductor structures of a given substrate, such as the substrate 20 and the next adjoining substrate chip 15, could also be established with solder.

Still referring to FIG. 2, the solder structures 100 of the circuit board 35 are positioned in respective openings 110 in a solder mask 115. The solder structures 100 are formed in ohmic contact with corresponding conductor pads 120 that may, in turn, be connected to plural traces or other interconnect structures in the circuit board 35 that are not visible. If the circuit board 35 is fabricated as a device that will be mounted to another circuit board or other device, then, as noted above, the plural solder balls 50 may be positioned in respective openings 125 in another solder mask 130 formed on the lower surface 135 of the circuit board 35. The solder balls 50 are formed in ohmic contact with corresponding conductor pads 140 that may electrically interface with various other conductor pads 120 by way of the aforementioned, but not visible interconnect structures. The solder structures 100 and balls 50 may be composed of various solders, such as lead-based or lead-free solders. An exemplary lead-based solder may have a composition at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The solder masks 115 and 130 may be composed of a variety of materials suitable for solder mask fabrication, such as, for example, PSR-4000 AUS703 manufactured by Taiyo Ink Mfg. Co., Ltd. or SR7000 manufactured by Hitachi Chemical Co., Ltd. The underfill 45 may be positioned in a gap 145 between the substrate 15 and the circuit board 35 following the connection of the vias 90 to the solder structures 100.

To establish metallurgical bonds between the vias 90 and the solder structures 100, the stack 13 is put into the orientation depicted in FIG. 2 and positioned so that the vias 90 and the solder structures 100 are either in physical contact or in very close proximity. Thereafter, a reflow process is performed to liquefy at least the upper portions of solder structures 100 so that wetting between solder and the metal of the vias 90 occurs. The parameters for a suitable reflow process will depend on the compositions of the vias 90 and the solder structures 100. In an exemplary embodiment utilizing copper vias 90 and tin-silver solder structures 100, heating to about 220 to 240° C. for about 10 to 60 seconds may be suitable. It should be understood that FIG. 2 depicts the solder structures 100 following reflow.

The solder structures 100 are advantageously fabricated to project beyond a principal or outermost surface of the circuit board 35, which in this case is an outermost surface 147 of the solder mask 115. This arrangement gives the solder structures sufficient volume to readily wet to the vias 90 without the necessity of fitting the vias 90 with solder caps. A variety of techniques may be used to form the solder structures 100 with the desired height projection. In this regard, attention is now turned to FIG. 3, which is a sectional view like FIG. 2, but which illustrates the circuit board 35 and the stack 13 prior to the metallurgical bonding of the vias 90 to the solder structures 100. For simplicity of illustration, only a few of the elements labeled and discussed in FIG. 2 are labeled separately in FIG. 3. Here, the solder structures 100 are fabricated as solder pillars that project above the solder mask 115. The solder structures 100, shaped in this illustration as pillars, may be round, oval or rectangular or some other shape when viewed from above and may be fabricated using techniques to be described in more detail below. Again, to establish the requisite metallurgical bonds, the stack 13 is positioned so that vias 90 are in contact or in close proximity with the solder structures 100 and the aforementioned reflow processes performed.

Figure 4:
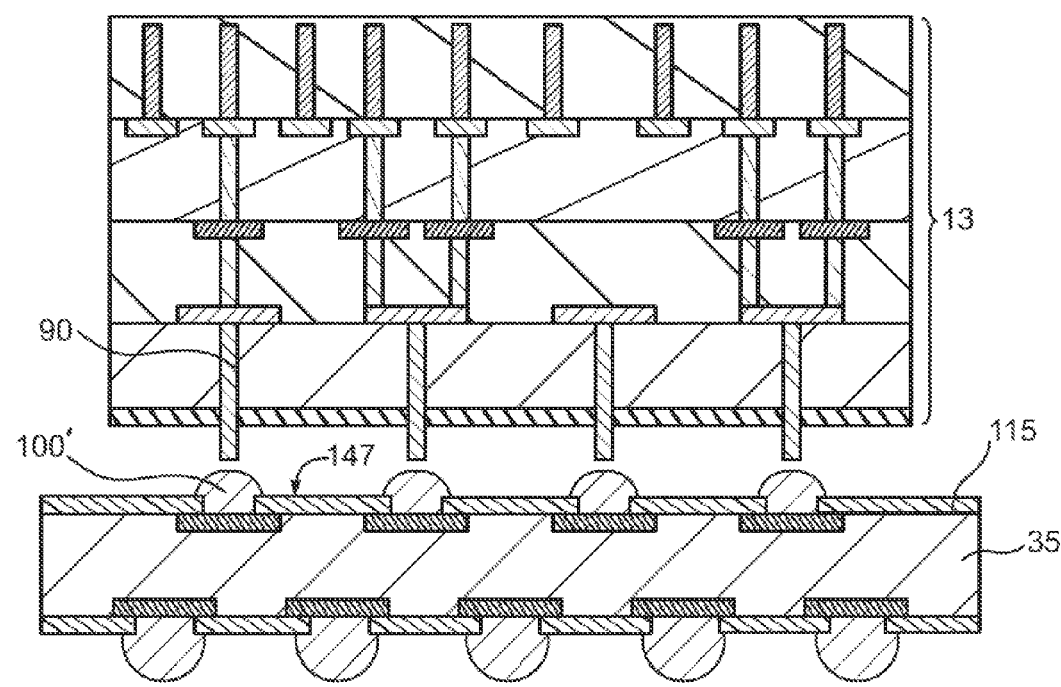
FIG. 4 is a sectional view like FIG. 3 but of an alternate exemplary circuit board.

Optionally, and as depicted in FIG. 4, the solder structures, now numbered 100', may be initially fabricated as solder bumps or balls and the stack 13 positioned proximate the circuit board 35 so that the vias 90 may wet to the solder structures 100' in a reflow process. Again, the solder structures 100' project beyond the principal or outermost surface of the circuit board 35, which in this case is the outermost surface 147 of the solder mask 115. Techniques to fabricate the solder structures 100' as bumps or balls will be described in more detail below.

Figure 3:
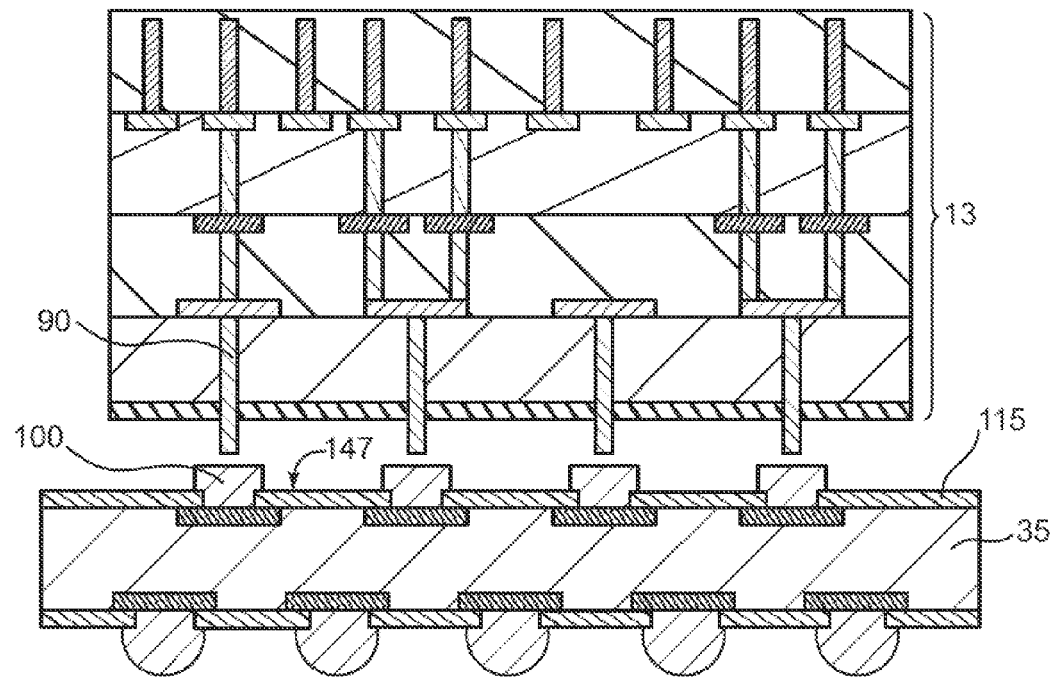
FIG. 3 is a sectional view of the exemplary stack of substrates prior to mounting to an exemplary circuit board.
Figure 5:
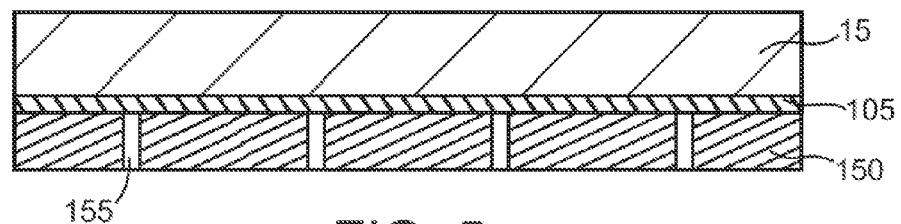
FIG. 5 is a sectional view of one of the substrates undergoing masking.
Figure 6:
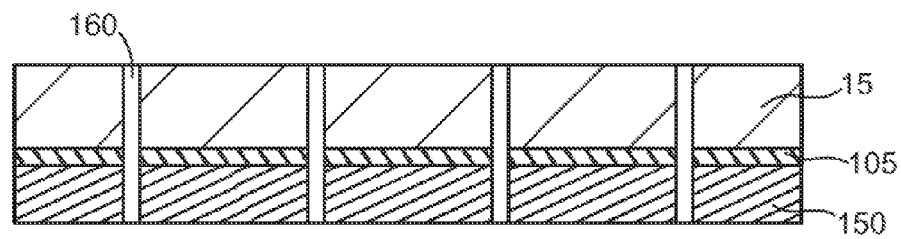
FIG. 6 is a sectional view of the substrate undergoing via hole formation.

An exemplary process flow for fabricating the vias 90 depicted in FIGS. 2, 3 and 4 may be understood by referring now to FIGS. 5, 6, 7 and 8 and initially to FIG. 5, which is a sectional view of the substrate 15 after application of the polymeric layer 105 but prior to the fabrication of the aforementioned vias. At this stage, the substrate 15 could be singulated or part of a wafer. The substrate 15 could also be bonded to another die, substrate or wafer if desired. A mask 150 may be applied to the polymer layer 105 and patterned using well-known lithographic techniques to establish a series of openings 155. The openings 155 represent locations where a subsequent material removal process will establish bores, trenches or other openings in the substrate 15 where the vias will be formed. Next and as shown in FIG. 6, a material removal process may be performed to establish plural openings 160 that extend through the substrate 15. The material removal to establish the opening 160 may be performed by chemical etch with or without plasma enhancement, laser drilling or other material removal techniques. The material removal process first penetrates the polymer layer 105 and then the substrate 15. The mask 150 is left in place following the material removal process to establish the opening 160.

Figure 7:
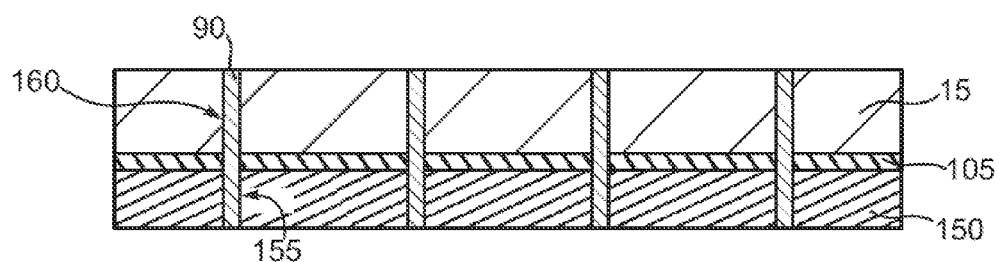
FIG. 7 is a sectional view of the substrate undergoing via formation.
Figure 8:
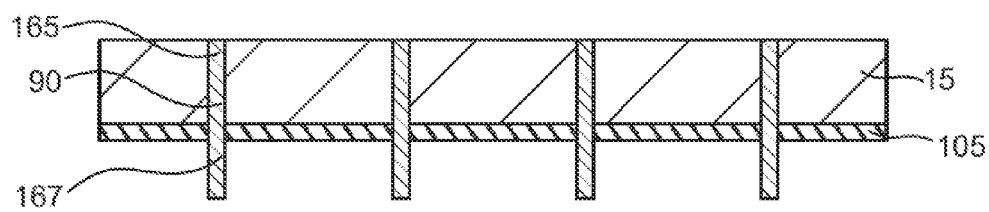
FIG. 8 is a sectional view of the substrate after mask removal.

Next and as depicted in FIG. 7, the vias 90 may be formed in the openings 160 of the substrate 15. Because an ultimate goal is to establish the vias 90 with ends that project beyond the polymer layer 105, the mask 150 is left in place during the via formation. A variety of processes may be used to establish the vias 90. In an exemplary embodiment, a plating process is used to deposit copper or an alloy thereof into the openings 155 in the mask 150 and ultimately the openings 160 of the semiconductor chip 15. If desired, the plating process may be performed in multiple steps with a first step used to establish a thin seed layer and a subsequent bulk plating process. With the vias 90 formed, the mask 150 may be removed as shown in FIG. 8. The mask removal may be by way of ashing, solvent stripping, combinations of the two or other mask removal techniques. At this stage, the vias 90 include ends 165 positioned in the substrate 15 and opposite ends 167 that project out of the substrate 15 and in this case beyond the polymer layer 105. The substrate 15 is ready to be joined to the other substrates 20, 25 and 30 of the stack 13, and the stack 13 to the circuit board 35 depicted in FIG. 2.

Figure 9:
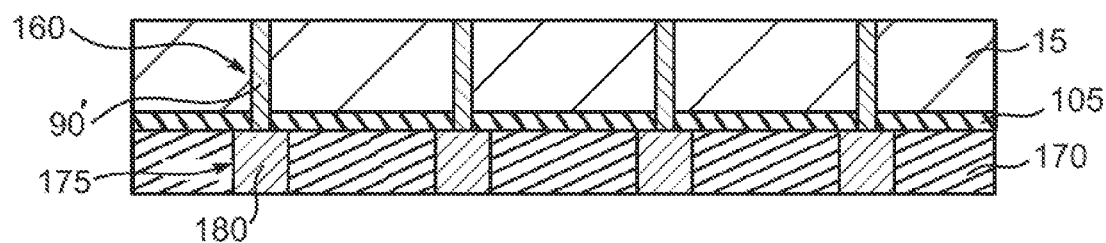
FIG. 9 is a sectional view like FIG. 7 but depicting an alternate exemplary via formation in the substrate.
Figure 10:
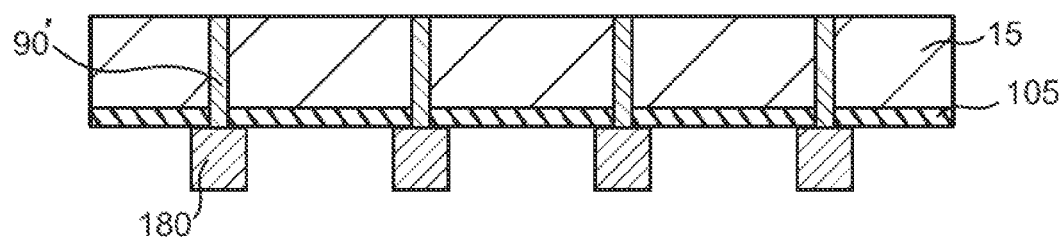
FIG. 10 is a sectional view like FIG. 9 but depicting the vias after mask removal.

An alternate exemplary process for fabricating the vias now numbered 90', may be understood by referring now to FIGS. 9 and 10. Unlike the previous exemplary process for forming the vias 90 depicted in FIGS. 5, 6, 7 and 8, where a single material deposition process is utilized to establish the vias, this alternative illustrative process may use a multi-step material deposition process. As shown in FIG. 9, which is a sectional view like FIG. 7, vias 90' may be established in the substrate 15 using the techniques described above in conjunction with FIGS. 5, 6, 7 and 8 generally with a few exceptions. In this regard, the mask 150 depicted in FIGS. 5, 6 and 7 may be removed following the formation of openings 160 in the substrate 15. With the mask removed, the vias 90' may be formed by the aforementioned material deposition techniques such as plating or otherwise but without the mask present so that extensions that project beyond the polymer layer 105 are not established. However, at this stage a mask 170 may be formed on the polymer layer 105 and suitably patterned lithographically with openings 175 that are positioned at the vias 90' and a subsequent material deposition process may be used to establish via extensions 180 that are in ohmic contact with the vias 90'. Thereafter, and as depicted in FIG. 10, the mask 170 may be removed using the aforementioned mask removal techniques to leave the projections 180 of the vias 90' extending beyond the polymer layer 100. At this stage, the substrate 15 may be joined to the other substrates 20, 25 and 30 of the stack 13, and the stack 13 to the circuit board 35 depicted in FIG. 2.

Figure 11:
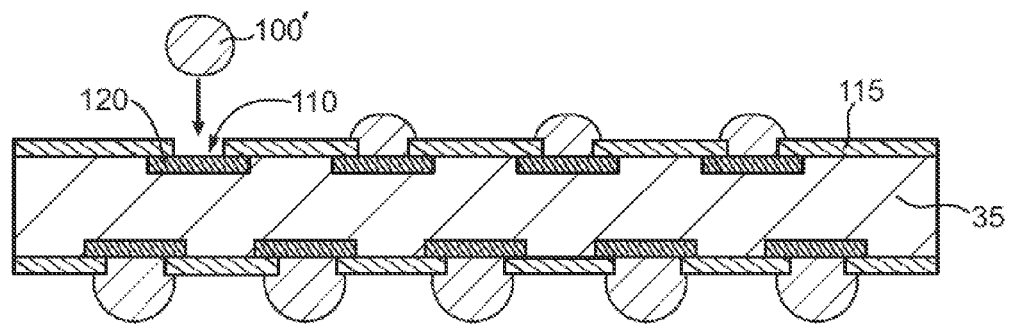
FIG. 11 is a sectional of an exemplary circuit board undergoing solder structure placement.

An exemplary process for fabricating the solder structures as solder bumps such as those depicted in FIG. 4 may be understood by referring now to FIG. 11, which is a sectional view of the circuit board following the application and patterning of the solder mask 115 with the respective openings 110. The openings 110 may be fabricated using lithographic patterning techniques suitable for solder masks. In this regard, if the solder mask 115 is composed of photo-sensitive materials then well-known lithographic exposure and developing techniques may be used to establish the openings 110. Optionally, if the solder mask 115 is composed of some sort of hard mask material then appropriate lithographic and material removal techniques may be applied. Following the formation of the openings 110, plural solder balls or bumps 100' may be placed in the openings 110 and in ohmic contact with the underlying pads 120. The bumps 100' could be positioned by way of pick and place, jet nozzle disposal or even a printing process in which the solder mask 115 would be purely optional.

Figure 12:
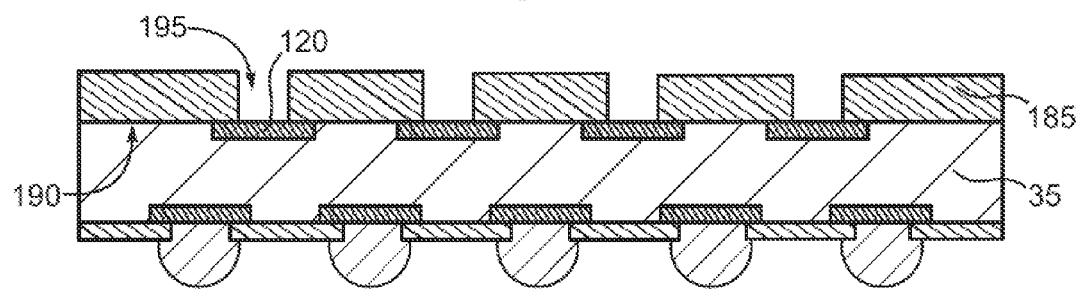
FIG. 12 is a sectional view of an exemplary circuit undergoing an alternate exemplary solder structure formation masking.
Figure 13:
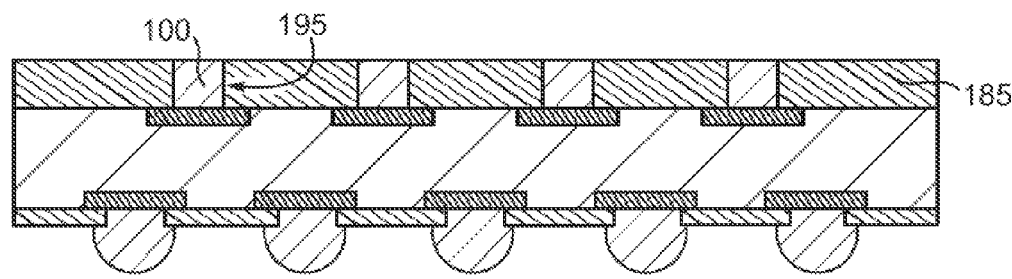
FIG. 13 is a sectional view like FIG. 12 depicting solder plating.
Figure 14:
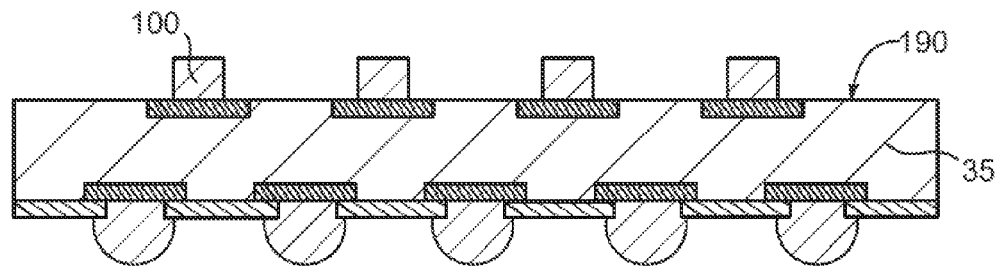
FIG. 14 is a sectional view like FIG. 13 depicting the solder structures following mask removal.

An alternate exemplary process flow for establishing the solder structures as pillars, like the pillars 100 depicted in FIG. 3, may be understood by referring now to FIGS. 12, 13 and 14 and initially to FIG. 12, which is a sectional view of the circuit board 35 following the fabrication of the conductor pads 120. Here, a mask 185 composed of photoresist or other suitable mask materials may be formed on a surface 190 of the circuit board 35 and patterned with plural openings 195 that are positioned over the corresponding conductor pads 120. Next and as depicted in FIG. 13, with the mask 185 in place, a plating process may be used to establish the solder pillars 100 in the respective openings 195. Again, a technical goal is to fabricate the mask 185 with a sufficient height so that the subsequently formed solder pillars 100 project significantly beyond the upper surface 190 of the circuit board 35. Other deposition techniques could be used, such as sputtering, e-beam deposition or others. The mask 185 could be composed of well-known solder mask materials that are photo sensitive and patternable using well known lithography techniques. Next and as shown in FIG. 14, the mask 185 may be removed to leave the solder pillars 100 projecting above the circuit board 35. Of course it may be desirable to provide some sort of insulating layer on the surface 190 of the circuit board 35 such as the solder mask material layer 115 depicted in FIG. 2 subsequent to the formation of the pillars 100. In this regard, the solder mask 115 could be applied and lithographically patterned to expose the pillars 100.

Figure 15:
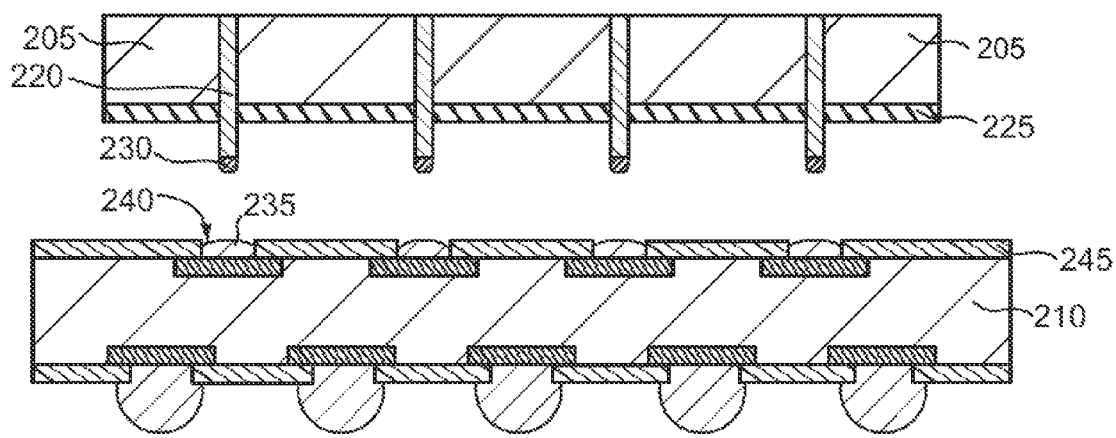
FIG. 15 is a sectional view of a conventional semiconductor chip-to-package substrate mounting utilizing copper pillars.

It may be useful at this point to contrast an exemplary conventional multiple chip stack-to-circuit board joining process and structure. Attention is now turned to FIG. 15, which is a sectional view depicting a conventional single semiconductor chip 205 positioned above a circuit board 210. The semiconductor chip 205 is provided with plural vias 220 that project beyond a polymer layer 225. The vias 220, however, are provided with corresponding solder caps 230 that are designed to metallurgically bond with corresponding solder paced structures 235 positioned in openings 240 in a solder mask 245 of the circuit board 210. The solder caps 230 are also necessary to provide enough solder volume to effectively establish metallurgical bonds with the low profile solder pace structures 235 of the circuit board 210 which are of course unlike the vertically projecting solder pillars 100 or bumps 100' described in the illustrative embodiments herein. The fabrication processes required to place the solder caps 230 on the respective vias 220 represents a cost center both in terms of materials and processing time.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
coupling a plurality of substrates to form a stack, wherein at least one of the plurality of substrates is a semiconductor chip;
forming a plurality of conductive vias in a first of the plurality of substrates using a first material deposition;
forming a plurality of via extensions that are in ohmic contact with the plurality of conductive vias in the first of the plurality of substrates, wherein the plurality of via extensions are formed using a subsequent material deposition; and
positioning the plurality of via extensions to a plurality of solder structures on a circuit board, wherein each of the solder structures includes a portion projecting beyond a solder mask on the circuit board.

2. The method of claim 1, wherein a second of the plurality of substrates comprises a semiconductor chip.

3. The method of claim 1, wherein a second of the plurality of substrates comprises an interposer.

4. The method of claim 1, further comprising forming a plurality of openings in the first of the plurality of substrates and forming at least first ends of the plurality of conductive vias in the plurality of openings by plating to form the plurality of conductive vias.

5. The method of claim 1, further comprising reflowing the solder structures to wet the plurality of via extensions.

6. The method of claim 5, further comprising forming an underfill layer between the stack and the solder mask.

7. A method of manufacturing, comprising:
 providing a circuit board and a solder mask on the circuit board, the solder mask including a plurality of openings;
 forming a solder structure in each of the plurality of solder mask openings, each of the solder structures including a portion projecting beyond the solder mask; and
 coupling the solder structures to corresponding via extensions of a stack of substrates, wherein at least one of the substrates is a semiconductor chip and the via extensions are in ohmic contact with corresponding conductive vias in the at least one of the substrates, and wherein the conductive vias are formed using a first material deposition and the via extensions are formed using a subsequent material deposition.

8. The method of claim 7, further comprising forming the solder structures on a plurality of conductor pads of the circuit board that correspond to the plurality of solder mask openings.

9. The method of claim 7, further comprising forming the solder structures as pillars.

10. The method of claim 7, further comprising forming the solder structures as balls.

11. The method of claim 8, further comprising applying the solder mask to the circuit board, forming the plurality of openings in the solder mask leading to the plurality conductor pads, and forming the solder structures in the plurality of openings that project beyond an outermost surface of the solder mask to form the solder structures.

\* \* \* \* \*